(12) United States Patent
Li et al.

(10) Patent No.: US 9,164,143 B2
(45) Date of Patent: Oct. 20, 2015

(54) METHOD AND DEVICE FOR DETECTING STATE OF OVERCURRENT PROTECTOR FOR BATTERY

(75) Inventors: Lin Li, Shenzhen (CN); Mingming Liu, Shenzhen (CN); Yanni Meng, Shenzhen (CN); Lingqiao Teng, Shenzhen (CN); Baohang Zhou, Shenzhen (CN); Shuwang Wei, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 339 days.

(21) Appl. No.: 13/979,380

(22) PCT Filed: Sep. 14, 2011

(86) PCT No.: PCT/CN2011/079603
§ 371 (c)(1),
(2), (4) Date: Jul. 12, 2013

(87) PCT Pub. No.: WO2012/094902
PCT Pub. Date: Jul. 19, 2012

(65) Prior Publication Data
US 2013/0338952 A1   Dec. 19, 2013

(30) Foreign Application Priority Data

Jan. 12, 2011  (CN) .......................... 2011 1 0005394

(51) Int. Cl.
| | | |
|---|---|---|
| G01R 31/28 | (2006.01) | |
| H02J 1/10 | (2006.01) | |
| H02J 7/00 | (2006.01) | |
| H02J 7/34 | (2006.01) | |
| G01R 31/327 | (2006.01) | |

(52) U.S. Cl.
CPC .............. *G01R 31/2827* (2013.01); *H02J 1/10* (2013.01); *H02J 7/0029* (2013.01); *H02J 7/0031* (2013.01); *H02J 7/34* (2013.01); *G01R 31/3277* (2013.01); *H02J 2007/0039* (2013.01)

(58) Field of Classification Search
CPC ..................... G01R 31/2827; G01R 19/16542; G01R 31/3655; G01R 31/3658; G01R 31/3606; G01R 31/3689; H02J 7/003; H02J 2007/0039; H02J 2007/004; H02J 2007/0037; H02J 2007/0001; H02J 7/0054; H02J 7/00; H02J 7/0068; H02J 7/042; H02J 7/0031; H02H 7/18
USPC .......................... 382/149; 144/212–213, 283; 438/14–48; 324/762.01–762.1
See application file for complete search history.

(56) References Cited

U.S. PATENT DOCUMENTS

| | | | |
|---|---|---|---|
| 6,335,577 B1 | 1/2002 | Baba | |
| 2001/0020802 A1* | 9/2001 | Kitagawa et al. | 307/66 |
| 2010/0194352 A1* | 8/2010 | Kitano et al. | 320/162 |
| 2010/0259856 A1 | 10/2010 | Senriuchi | |
| 2011/0205672 A1 | 8/2011 | Sakai | |
| 2011/0205678 A1* | 8/2011 | Baba et al. | 361/86 |
| 2012/0105008 A1* | 5/2012 | Lipcsei et al. | 320/134 |

FOREIGN PATENT DOCUMENTS

| | | |
|---|---|---|
| CN | 101005202 A | 7/2007 |
| CN | 201348654 Y | 11/2009 |
| CN | 102162823 A | 8/2011 |
| DE | 10005864 A1 | 1/2001 |
| JP | 2007033108 A | 2/2007 |
| WO | 2010032705 A1 | 3/2010 |

OTHER PUBLICATIONS

International Search Report in international application No. PCT/CN2011/079603, mailed on Dec. 15, 2011.

English Translation of the Written Opinion of the International Search Authority in international application No. PCT/CN2011/079603, mailed on Dec. 15, 2011.

Supplementary European Search Report in European application No. 11855608.3, mailed on May 7, 2015.

\* cited by examiner

*Primary Examiner* — Sujoy Kundu
*Assistant Examiner* — Lisa Peters
(74) *Attorney, Agent, or Firm* — Oppendahl Patent Law Firm LLC (57) ABSTRACT

The disclosure discloses a method and device for detecting a state of an overcurrent protector for a battery, wherein a voltage $U_{out}$ of a power supply and a voltage $U_{bat}$ of a battery connected to the power supply via an overcurrent protector is acquired, and $U=|U_{out}-U_{bat}|$ is calculated; when $U_L \leq U \leq U_H$ and $|I_{bat}| \leq I_{min}$, the voltage of the power supply is adjusted to be $U'_{out}$, wherein $U_L$ and $U_H$ are the minimum value and maximum value of a difference between the voltage of the power supply and the voltage of the battery, respectively, $I_{bat}$ is a current of the battery, and $I_{min}$ is a current detecting precision for detecting a current equipment of the battery; the voltage of the battery $U'_{bat}$ after adjusting the voltage of the power supply is acquired, and $U'=|U'_{out}-U'_{bat}|$ is calculated; and a state of the overcurrent protector for the battery is determined. With the disclosure, in the case that the difference between the voltage of the battery and the supply voltage is small, by regulating the supply voltage and comparing the voltage difference across the overcurrent protector again, accurate detection of the state of the overcurrent protector for the battery as well as reduction of detecting costs is enabled.

10 Claims, 7 Drawing Sheets

METHOD AND DEVICE FOR DETECTING STATE OF OVERCURRENT PROTECTOR FOR BATTERY

TECHNICAL FIELD

The disclosure relates to the technical field of electrics, in particular to a method and device for detecting a state of an overcurrent protector for a battery.

BACKGROUND

Figure 1:
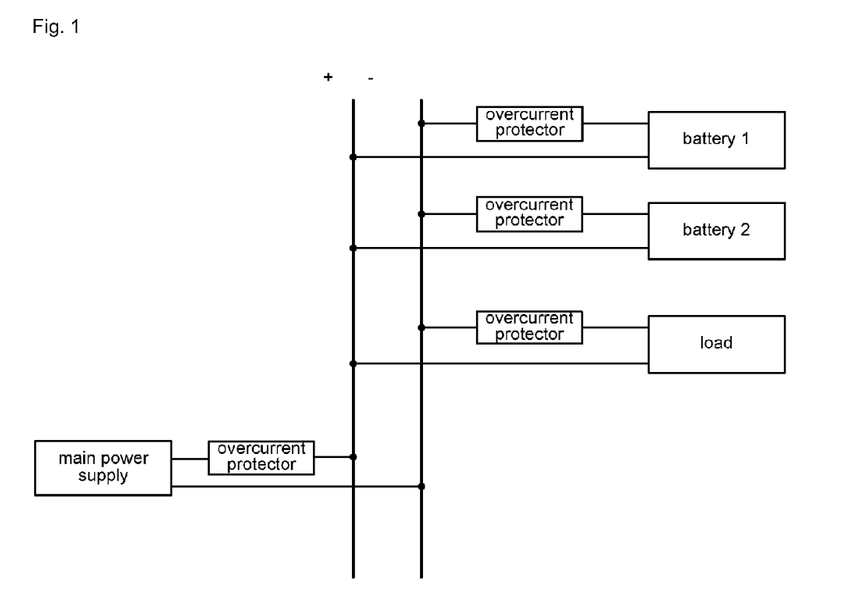
FIG. 1 is a schematic diagram of the structure of a load supply system containing an overcurrent protector for a battery in the prior art.

In a common load supply system, as backup power of the system, a battery realizes that a load continues to function properly in the case of a main power supply source failure, which ensures the stable and reliable operation of the system. Overcurrent protection for a battery is implemented by cascading an overcurrent protector at a battery input port. When the battery is overly charged/discharged, or the temperature thereof is too high, the overcurrent protector can disconnect automatically so as to protect a load equipment and the battery. The state of the overcurrent protector for the battery is of vital importance, which describes the charging/discharging state of the battery and reflects whether the overcurrent protector is damaged and connected. In the load supply system, the location of the overcurrent protector for battery protection in the whole system is shown in FIG. 1, wherein the system includes a main power supply, the overcurrent protector, the battery, the load and the like.

Figure 2:
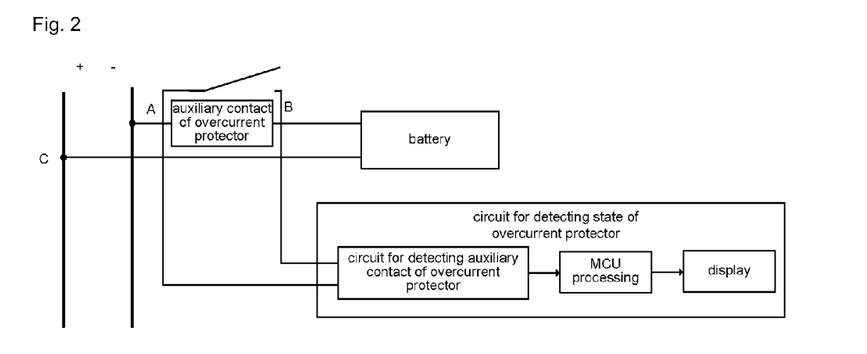
FIG. 2 is a schematic diagram of a circuit for deciding a state of an overcurrent protector according to a state of an auxiliary contact of an overcurrent protector in the prior art.
Figure 3:
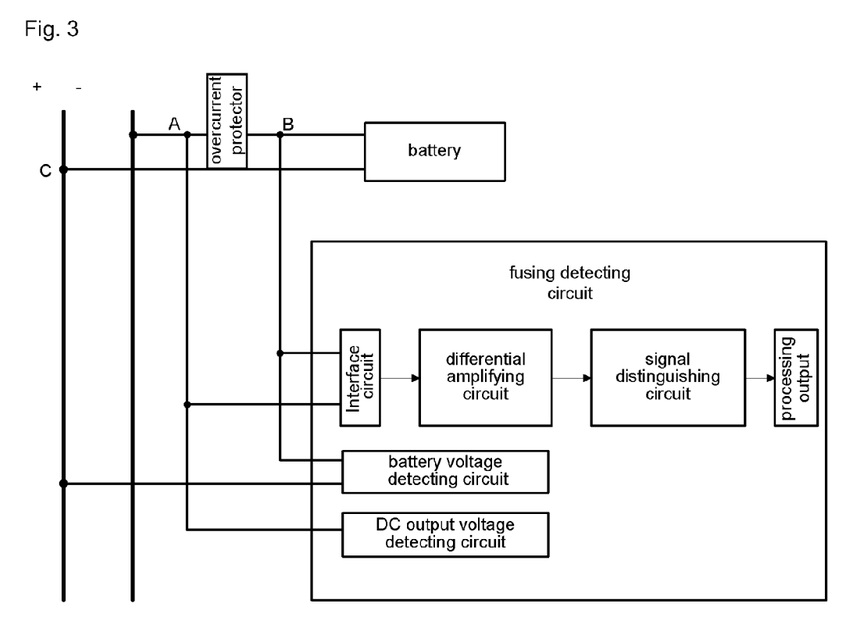
FIG. 3 is a schematic diagram of a circuit for deciding a state of an overcurrent protector according to a voltage difference between a battery voltage and a supply voltage in the prior art.

In general, there are two methods for deciding a state of an overcurrent protector. One is to decide the state of the overcurrent protector according to a state of an auxiliary contact of the overcurrent protector. As shown in FIG. 2, disconnection of the overcurrent protector will lead to jump of the auxiliary contact of the overcurrent protector, the jump of the auxiliary contact is detected via a hardware circuit, thus deciding the state of the overcurrent protector; the other is to decide the state of the overcurrent protector for the battery according to a voltage difference between a battery voltage and a system voltage, namely, voltage difference across the overcurrent protector for the battery. As shown in FIG. 3, when the overcurrent protector is disconnected (OFF), the battery voltage and the system voltage are not the same, the voltage difference across the overcurrent protector is compared, and then the voltage difference is converted to a numerical quantity, via which the state of the overcurrent protector is decided.

The detecting method to decide the state of the overcurrent protector according to the state of the auxiliary contact of the overcurrent protector has the following disadvantages: in general, the auxiliary contact adopts a mechanical transmission, which will often lead to the ineffectiveness of the auxiliary contact, thereby making the detection unreliable; compared with the overcurrent protector without the auxiliary contact, the overcurrent protector with the auxiliary contact is higher in price, and has no advantage in terms of costs; and the method requires that a system monitoring equipment must have a hardware detecting circuit for the auxiliary contact, which increases monitoring hardware costs.

The method for deciding the state of the overcurrent protector for the battery according to the voltage difference between the battery voltage and the system voltage has the following disadvantages: the voltage difference between the battery voltage and the system voltage is associated with the quality and extent of charging/discharging of the battery, when the quality of the battery is good and the extent of charging/discharging is low, this voltage difference will be very small. And the voltage difference decision will usually be based on one fixed criterion, in the case of a low voltage difference across the overcurrent protector, this will thus inevitably lead to the misjudgement of the state of the overcurrent protector. In addition, the method requires that a DC power monitoring equipment must have a voltage interface circuit and a voltage comparing and distinguishing circuit, which increases monitoring hardware costs.

SUMMARY

The technical problem to be solved by the disclosure is to provide a method and device for detecting a state of an overcurrent protector for a battery, so as to solve the problem of low reliability or misjudgement when deciding the state of the overcurrent protector in the prior art.

To solve the aforementioned technical problem, on one hand, the disclosure provides a method for detecting a state of an overcurrent protector for a battery, which includes:

acquiring a voltage $U_{out}$ of a power supply and a voltage $U_{bat}$ of a battery connected to the power supply via an overcurrent protector, and calculating U, wherein $U=|U_{out}-U_{bat}|$;

when $U_L \leq U \leq U_H$ and $|I_{bat}| \leq I_{min}$, adjusting the voltage of the power supply to be $U'_{out}$, wherein $U_L$ is a minimum value of a difference between the voltage of the power supply and the voltage of the battery, $U_H$ is a maximum value of the difference between the voltage of the power supply and the voltage of the battery, $I_{bat}$ is a current of the battery, and $I_{min}$ is a current detecting precision of an equipment for detecting the current of the battery;

acquiring the voltage of the battery $U'_{bat}$ after adjusting the voltage of the power supply, and calculating U', wherein $U'=|U'_{out}-U'_{bat}|$; and determining a state of the overcurrent protector for the battery.

Furthermore, when $U_{out}>U_{bat}$, $U'_{out}=U_{out}+\Delta u$; when $U_{out} \leq U_{bat}$, $U'_{out}=U_{out}-\Delta u$, wherein $\Delta u$ is an adjustment value of the voltage of the power supply.

Furthermore, the determining a state of the overcurrent protector for the battery may include: when $U' \leq U_H$, the state of the overcurrent protector for the battery is ON; when $U'>U_H$, the state of the overcurrent protector for the battery is OFF.

Furthermore, the determining a state of the overcurrent protector for the battery may include: when $U<U_L$ or $|I_{bat}|>I_{min}$, the state of the overcurrent protector for the battery is ON.

Furthermore, the determining a state of the overcurrent protector for the battery may include: when $U>U_H$ and $|I_{bat}| \leq I_{min}$, the state of the overcurrent protector for the battery is OFF.

On the other hand, the disclosure further provides a device for detecting a state of an overcurrent protector for a battery, which includes:

an initial voltage difference acquiring unit, which is configured to acquire a voltage $U_{out}$ of a power supply and a voltage $U_{bat}$ of a battery connected to the power supply via an overcurrent protector, and to calculate U, wherein $U=|U_{out}-U_{bat}|$;

a power supply voltage adjusting unit, which is configured to adjust, when $U_L \leq U \leq U_H$ and $|I_{bat}| \leq I_{min}$, the voltage of the power supply to be $U'_{out}$, wherein $U_L$ is a minimum value of a difference between the voltage of the power supply and the voltage of the battery, $U_H$ is a maximum value of the difference between the voltage of the power supply and the voltage of the battery, $I_{bat}$ is a current of the battery, and $I_{min}$ is a current detecting precision of an equipment for detecting the current of the battery;

a post-adjustment voltage difference acquiring unit, which is configured to acquire the voltage of the battery $U'_{bat}$ after adjusting the voltage of the power supply, and to calculate U', wherein $U'=|U'_{out}-U'_{bat}|$; and a state determining unit, which is configured to determine a state of the overcurrent protector for the battery.

Furthermore, when out $U_{out}>U_{bat}$, $U'_{out}=U_{out}+\Delta u$; when $U_{out} \leq U_{bat}$, $U'_{out}=U_{out}-\Delta u$, wherein $\Delta u$ wherein $\Delta u$ is an adjustment value of the voltage of the power supply.

Furthermore, when $U' \leq U_H$, the state determining unit may determine that the state of the overcurrent protector for the battery is ON; when $U'>U_H$, the state determining unit may determine that the state of the overcurrent protector for the battery is OFF.

Furthermore, when $U<U_L$ or $|I_{bat}|>I_{min}$, the state determining unit may determine that the state of the overcurrent protector for the battery is ON.

Furthermore, when $U>U_H$ and $|I_{bat}| \leq I_{min}$, state determining unit may determine that the state of the overcurrent protector for the battery is OFF.

The beneficial effect of the disclosure is as follows.

With the disclosure, in the case that the difference between the battery voltage and the supply voltage is small, by regulating the supply voltage and comparing the voltage difference across the overcurrent protector again, accurate detection of the state of the overcurrent protector for the battery is enabled, with a high reliability and a low possibility of misjudgement. In addition, the state of the overcurrent protector for the battery is decided just by using existing detect data, without the need for additional expansion of a circuit for detecting the state of the overcurrent protector, thereby reducing detecting costs.

DETAILED DESCRIPTION

To solve the problem of low reliability or misjudgement when deciding a state of an overcurrent protector in the prior art, the disclosure provides a method and device for detecting a state of an overcurrent protector for a battery, and is further elaborated below with reference to the drawings and embodiments. It should be understood that, a specific embodiment described herein is merely intended to explain the disclosure, and is not intended to limit the disclosure.

Figure 4:
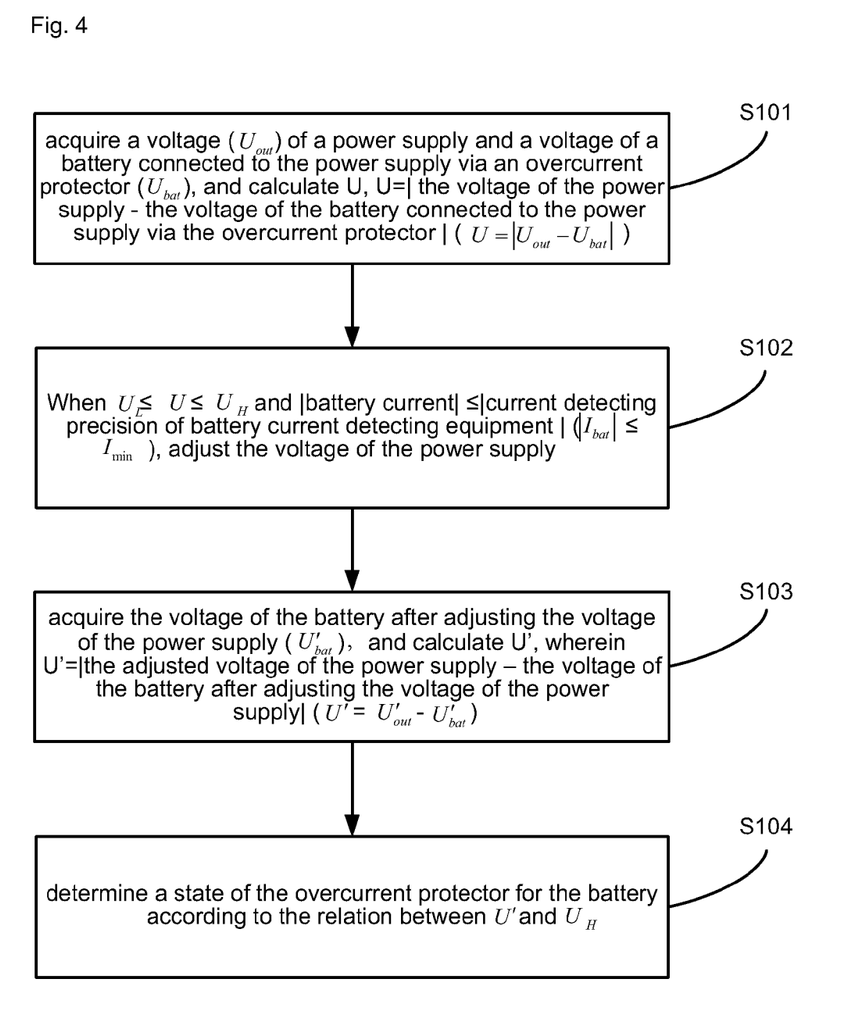
FIG. 4 is a flowchart of a method for detecting a state of an overcurrent protector for a battery in an embodiment of the disclosure.
Figure 5:
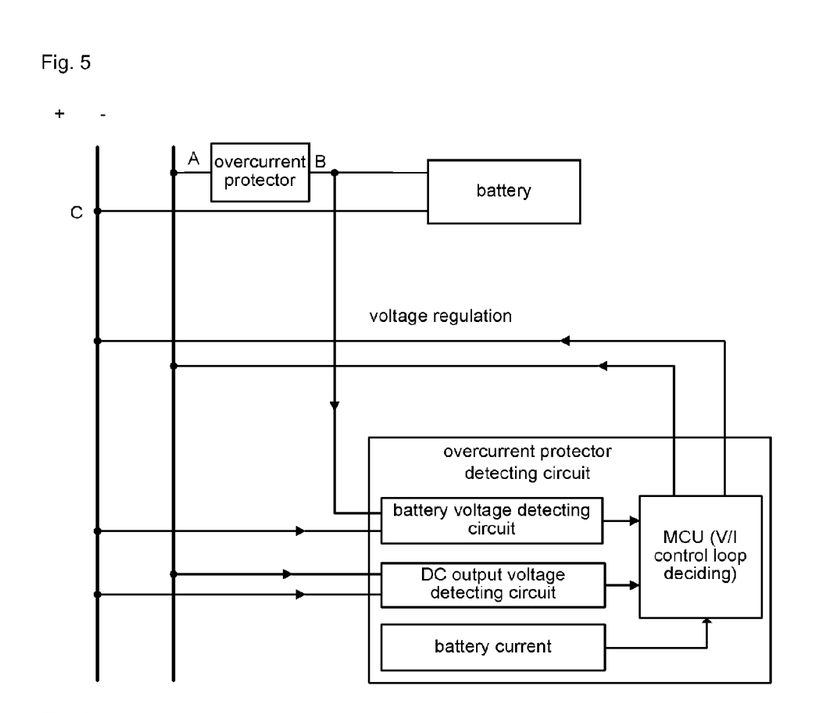
FIG. 5 is a schematic diagram of a circuit for detecting a state of an overcurrent protector for a battery in an embodiment of the disclosure.

FIG. 4 is a flowchart of a method for detecting a state of an overcurrent protector for a battery in an embodiment of the disclosure; FIG. 5 is a schematic diagram of a circuit for detecting a state of an overcurrent protector for a battery in an embodiment of the disclosure; as shown in FIG. 4 and FIG. 5, an embodiment of the disclosure relates to a method for detecting a state of an overcurrent protector for a battery, which includes the following steps:

Step S101: a voltage $U_{out}$ of a power supply and a voltage $U_{bat}$ of a battery connected to the power supply via an overcurrent protector are acquired, and a difference between the voltage of the power supply and the voltage of the battery $U=|U_{out}-U_{bat}|$ is calculated;

Step S102: first, the minimum value $U_L$ of and the maximum value $U_H$ of the difference between the voltage of the power supply and the voltage of the battery, a current $I_{bat}$ of the battery to be detected, and a current detecting precision $I_{min}$ of an equipment for detecting the current of the battery are to be set up beforehand; $U_L$ and $U_H$ are associated with the hardware detecting circuit and a detecting precision. A user may sets up $U_L$, $U_H$ according to an empirical value, or may eventually obtain a proper value through multiple tests and adjustments after the setup. $I_{min}$ is associated with factors such as the precesion of a battery current detecting circuit, a battery capacity and the like, and may be measured by a detecting instrument.

Figure 6:
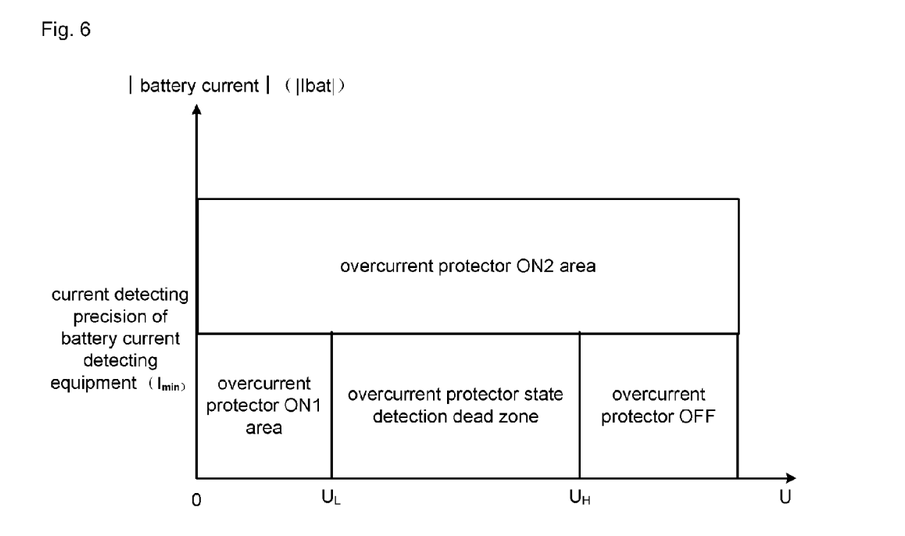
FIG. 6 is a diagram of zones for deciding a state of an overcurrent protector for a battery in an embodiment of the disclosure.

When $|I_{bat}|>I_{min}$, namely, when an absolute value of a battery current exceeds $I_{min}$, a charging or discharging current of the battery shows that the battery is still coupled to a system output, it thus may be decided that the overcurrent protector for the battery is normal, namely, the state of the overcurrent protector is ON, in which case a deciding area is an ON2 area of the overcurrent protector in FIG. 6.

When $|I_{bat}| \leq I_{min}$ and $U<U_L$, namely, when an absolute value of a voltage difference across the overcurrent protector for the battery is smaller than $U_L$, the battery should be connected to a system output end via the overcurrent protector for the battery, so there is substantially no voltage difference between the two, thus the state of the overcurrent protector for the battery is normal, namely, the state of the overcurrent protector is ON, in which case the deciding area is an ON1 area of the overcurrent protector for the battery in FIG. 6.

when $|I_{bat}| \leq I_{min}$ and $U>U_H$, namely, when the absolute value of the voltage difference across the overcurrent protector for the battery is greater than $U_H$, the battery should be disconnected from the system output end, thus the state of the overcurrent protector for the battery is OFF. In which case, the deciding area is an OFF area of the overcurrent protector for the battery in FIG. 6.

When $|I_{bat}| \leq I_{min}$ and $U_L \leq U \leq U_H$, namely, the voltage difference across the overcurrent protector for the battery exists between $U_L$ and $U_H$, and the absolute value of the battery current is smaller than $I_{min}$, in which case the deciding of the state of the overcurrent protector for the battery decide enters a detection dead zone shown in FIG. 6, in which case, due to the constraint of the detecting precision of the hardware circuit and the extent of battery charging/discharging, it is impossible to decide distinctly the state of the overcurrent protector for the battery, thereby easily leading to a misjudgement. In this case, it is possible to decide whether there is a following relation between the battery voltage and the voltage of the power supply, and to decide the state of the overcurrent protector, by deciding whether the battery voltage changes after a system voltage adjustment. Thus, when $U_L \leq U \leq U_H$ and $|I_{bat}| \leq I_{min}$, regulation of the system voltage (the voltage of the main power supply) $U_{out}$ is implemented by regulating the voltage of the main power supply, the voltage of the power supply is adjusted to be $U'_{out}$; the adjustment value of the voltage of the power supply is $\Delta u$, wherein $\Delta u$ is associated with $(U_{out}-U_{bat})$, $U_H$, and voltage stability. the range for selecting $\Delta u$ is $[U_{out}-U_{bat}, U_H]$, when $U_{out}>U_{bat}$, $U'_{out}=U_{out}+\Delta u$; when $U_{out} \leq U_{bat}$, $U'_{out}=U_{out}-\Delta u$, such an adjusting range both satisfies a stability requirement of the system output voltage, and can promptly push the deciding area from the dead zone to a distinct area.

Figure 7:
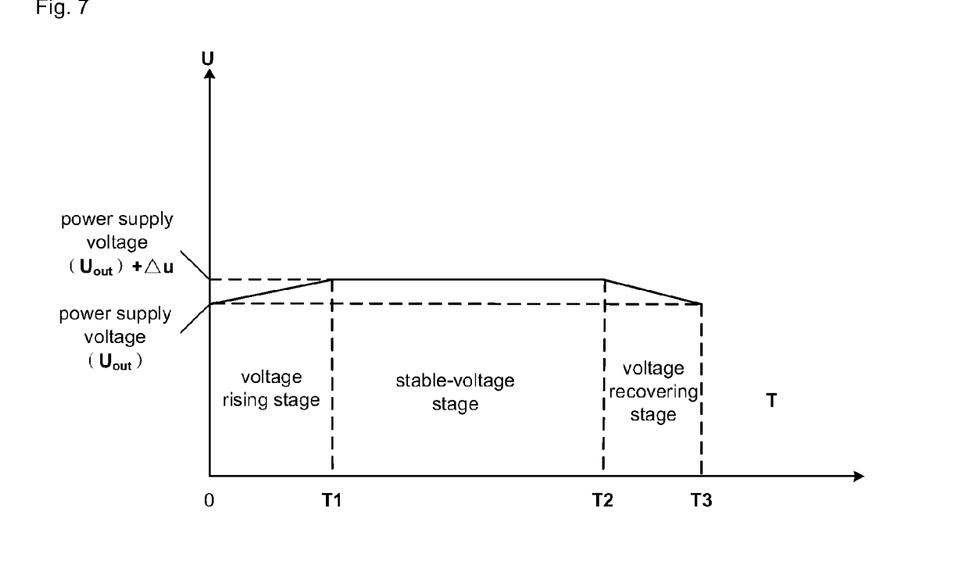
FIG. 7 is a schematic diagram of the variation of a power supply voltage with time during voltage adjustment of the power supply in an embodiment of the disclosure.

A process for regulating the system voltage (the voltage of the power supply) is as shown in FIG. 7; a stable-voltage period $T_2$ and a voltage adjusting period $T_1$ for the system are associated with a voltage adjusting mode of the system and the stability requirement of the system. After a voltage recovering period $T_3$ for the system lapses, the system voltage returns to normal, and the state of the overcurrent protector for the battery at this moment is the state determined in the end.

Step S103: the voltage of the battery $U'_{bat}$ after adjustment of the voltage of the power supply is acquired, that is, the voltage of the battery is detected after a main power supply system voltage is adjusted, then the difference between the voltage of the power supply and the voltage of the battery $U'=|U'_{out}-U'_{bat}|$ is calculated after the main power supply system voltage is adjusted; and Step S104: the state of the overcurrent protector for the battery is determined according to the relation between U' and $U_H$. If the voltage difference U' is greater than $U_H$, it shows that the overcurrent protector for the battery is disconnected; if the voltage difference U' is smaller than or equal to $U_H$, it means that the overcurrent protector is normal, namely, in the ON state.

Figure 8:
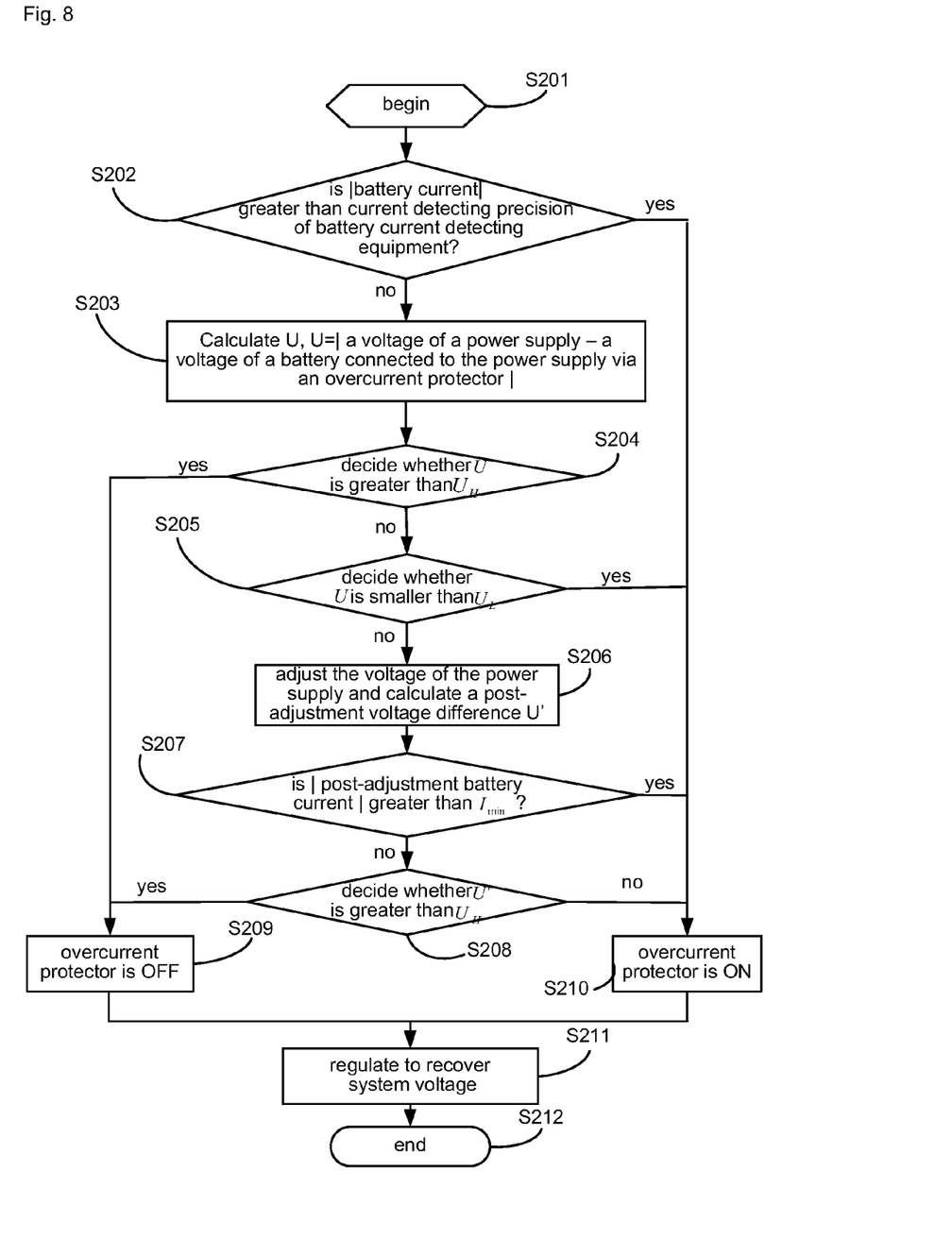
FIG. 8 is a flowchart of another method for detecting a state of an overcurrent protector for a battery in an embodiment of the disclosure.

Taking a certain communication base station as an example, the AC input of the DC power for communication of the base station is 220V, and a single phase 220V rectifying module is adopted, with a DC output of −48V; the battery capacity is 500 Ah, and the overcurrent protector for the battery adopts a fuse. $I_{min}$ is set to be 0.6 A, $U_H$ is set to be 0.6V, and $U_L$ is set to be 0.3V; the flowchart of a method for deciding the state of the overcurrent protector for the battery is as shown in FIG. 8, and includes the following steps:

Step S201: begin;

Step S202: first, decide whether $|I_{bat}|$ is greater than $I_{min}$; if yes, go to step S210; otherwise, go to step S203. The reason the present step is carried out first is because, as shown in FIG. 6, when $|I_{bat}|$ is greater than $I_{min}$, the overcurrent protector for the battery is in the ON state, the state of the overcurrent protector for the battery may be obtained straightforwardly.

Step S203: acquire a battery voltage $U_{bat}$ and a system voltage $U_{out}$, then get an absolute value of a voltage difference U between the two, namely, the absolute value of the voltage difference across the overcurrent protector for the battery U, $U=|U_{out}-U_{bat}|$;

Step S204: decide whether U is greater than $U_H$, namely, decide whether U is greater than 0.6V; if yes, go to step S209; otherwise, go to step S205;

Step S205: decide whether U is smaller than $U_L$, namely, decide whether U is smaller than 0.3V; if yes, go to step S210; otherwise, go to step S206;

Step S206: when $0.3V \leq U \leq 0.6V$, and $|I_{bat}| \leq 0.6$ A, it is impossible to decide the ON/OFF state of the overcurrent protector, in which case a deciding by voltage adjustment is required. If $U_{out}>U_{bat}$, a system voltage after regulation $U'_{out}=U_{out}+0.6$; if $U_{out}<U_{bat}$, the system voltage after regulation $U'_{out}=U_{out}-0.6$; the voltage difference across the overcurrent protector for the battery is acquired again, wherein the voltage of the battery is $U'_{bat}$ after the voltage of the power supply is adjusted; $U'=|U'_{out}-U'_{bat}|$ is calculated;

Step S207: decide whether $|I'_{bat}|$ is greater than $I_{min}$; if yes, go to step S210; otherwise, go to step S208; wherein $|I'_{bat}|$ is the current of the battery after the voltage of the power supply is adjusted;

Step S208: decide whether U' is greater than $U_H$, namely, decide whether U' is greater than 0.6V; if yes, go to step S209; otherwise, go to step S210;

Step S209: decide that the state of the overcurrent protector for the battery is OFF;

Step S210: decide that the state of the overcurrent protector for the battery is normal, namely, the state of the overcurrent protector for the battery is ON;

Step S211: recover the power supply DC output voltage to $U_{out}$, display the state of the overcurrent protector, and complete the detection; and Step S212: end.

Figure 9:
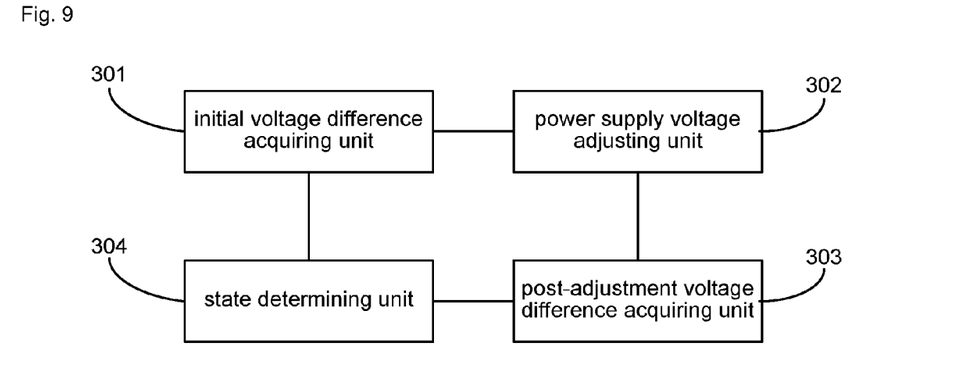
FIG. 9 is a schematic diagram of the structure of a device for detecting a state of an overcurrent protector for a battery in an embodiment of the disclosure.

As shown in FIG. 9, the disclosure further relates to a device for implementing the aforementioned method, namely, a device for detecting a state of an overcurrent protector for a battery, which includes:

an initial voltage difference acquiring unit 301 configured to acquire a voltage $U_{out}$ of a power supply and a voltage $U_{bat}$ of a battery connected to the power supply via an overcurrent protector, and to calculate U, wherein $U=|U_{out}-U_{bat}|$;

a power supply voltage adjusting unit 302 configured to adjust, when $U_L \leq U \leq U_H$ and $|I_{bat}| \leq I_{min}$, the voltage of the power supply to be $U'_{out}$, wherein $U_L$ is the minimum value of the difference between the voltage of the power supply and the voltage of the battery, $U_H$ is the maximum value of the difference between the voltage of the power supply and the voltage of the battery, $I_{bat}$ is a current of the battery, and $I_{min}$ is a current detecting precision of an equipment for detecting the current of the battery;

a post-adjustment voltage difference acquiring unit 303 configured to acquire the voltage of the battery $U'_{bat}$ after adjusting the voltage of the power supply, and to calculate U', wherein $U'=|U'_{out}-U'_{bat}|$; and a state determining unit 304 configured to determine a state of the overcurrent protector for the battery according to the relation of U' and $U_H$.

Wherein, when $U_{out}>U_{bat}$, $U'_{out}=U_{out}+\Delta u$; when $U_{out} \leq U_{bat}$, $U'_{out}=U_{out}-\Delta u$, wherein $\Delta u$ is the adjustment value of the voltage of the power supply.

Wherein, when $U<U_L$ or $|I_{bat}|>I_{min}$, the state of the overcurrent protector for the battery is ON.

Wherein, when $U' \leq U_H$, the state of the overcurrent protector for the battery is ON; when $U'>U_H$, the state of the overcurrent protector for the battery is OFF.

Wherein, when $U>U_H$ and $|I_{bat}| \leq I_{min}$, the state of the overcurrent protector for the battery is OFF.

It can be seen from the aforementioned embodiments that, the disclosure may decide the state of the overcurrent protector for the battery just by using existing detect data, without the need for increasing or expanding a circuit for detecting the state of the overcurrent protector, thereby reducing monitoring hardware costs. Moreover, in the case of a small voltage difference between the battery voltage and the system voltage, by regulating the system voltage and comparing the voltage difference across the overcurrent protector again, accurate detection of the state of the overcurrent protector for the battery is enabled, enhancing the sensitivity in detecting the state of the overcurrent protector. In addition, the battery current is introduced as an additional basis for deciding, accelerating the speed in deciding the state of the overcurrent protector for the battery, which is in better accordance with a real-time requirement.

Although a preferred embodiment of the disclosure is disclosed for purpose of illustration, a skilled person in the art will be aware of various improvements as well as possible additions and replacements; thus, the scope of the disclosure should not be limited to the aforementioned embodiments.

INDUSTRIAL APPLICABILITY

With the disclosure, in the case that the difference between the voltage of the battery and the supply voltage is small, by regulating the supply voltage and comparing the voltage difference across the overcurrent protector again, accurate detection of the state of the overcurrent protector for the battery is enabled, with a high reliability and a low possibility of misjudgement. In addition, the state of the overcurrent protector for the battery is decided just by using existing detect data, without the need for additional extpansion of a circuit for detecting the state of the overcurrent protector, thereby reducing detecting costs.

What is claimed is:

1. A method for detecting a state of an overcurrent protector for a battery, comprising:
   acquiring a voltage $U_{out}$ out of a power supply and a voltage $U_{bat}$ of a battery connected to the power supply via an overcurrent protector, and calculating U, wherein $U=|U_{out}-U_{bat}|$;
   when $U_L \leq U \leq U_H$ and $|I_{bat}| \leq I_{min}$ and adjusting the voltage of the power supply to be $U'_{out}$, wherein $U_L$ is a minimum value of a difference between the voltage of the power supply and the voltage of the battery, $U_H$ is a maximum value of the difference between the voltage of the power supply and the voltage of the battery, $I_{bat}$ is a current of the battery, and $I_{min}$ is a current detecting precision of an equipment for detecting the current of the battery;
   acquiring the voltage of the battery $U'_{bat}$ after adjusting the voltage of the power supply, and calculating U', wherein $U'=|U'_{out}-U'_{bat}|$; and
   determining a state of the overcurrent protector for the battery.

2. The method for detecting a state of an overcurrent protector for a battery according to claim 1, wherein when $U_{out}>U_{bat}$, $U'_{out}=U_{out}+\Delta u$; when $U_{out} \leq U_{bat}$, $U'_{out}=U_{out}-\Delta u$, wherein $\Delta u$ is an adjustment value of the voltage of the power supply.

3. The method for detecting a state of an overcurrent protector for a battery according to claim 1, wherein the determining a state of the overcurrent protector for the battery comprises: when $U' \leq U_H$, the state of the overcurrent protector for the battery is ON; when $U'>U_H$, the state of the overcurrent protector for the battery is OFF.

4. The method for detecting a state of an overcurrent protector for a battery according to claim 1, wherein the determining a state of the overcurrent protector for the battery comprises: when $U<U_L$ or $|I_{bat}|>I_{min}$, the state of the overcurrent protector for the battery is ON.

5. The method for detecting a state of an overcurrent protector for a battery according to claim 1, wherein the determining a state of the overcurrent protector for the battery comprises: when $U>U_H$ and $|I_{bat}| \leq I_{min}$, the state of the overcurrent protector for the battery is OFF.

6. A device for detecting a state of an overcurrent protector for a battery, comprising:
   an initial voltage difference acquiring unit, which is configured to acquire a voltage $U_{out}$ of a power supply and a voltage $U_{bat}$ of a battery connected to the power supply via an overcurrent protector, and to calculate U, wherein $U=|U_{out}-U_{bat}|$;
   a power supply voltage adjusting unit, which is configured to adjust, when $U_L \leq U \leq U_H$ and $|I_{bat}| \leq I_{min}$, the voltage of the power supply to be $U'_{out}$, wherein $U_L$ is a minimum value of a difference between the voltage of the power supply and the voltage of the battery, $U_H$ is a maximum value of the difference between the voltage of the power supply and the voltage of the battery, $I_{bat}$ is a current of the battery, and $I_{min}$ is a current detecting precision of an equipment for detecting the current of the battery;
   a post-adjustment voltage difference acquiring unit, which is configured to acquire the voltage of the battery $U'_{bat}$ after adjusting the voltage of the power supply, and to calculate U', wherein $U'=|U'_{out}-U'_{bat}|$; and
   a state determining unit, which is configured to determine a state of the overcurrent protector for the battery.

7. The device for detecting a state of an overcurrent protector for a battery according to claim 6, wherein when $U_{out}>U_{bat}$, $U'_{out}=U_{out}+\Delta u$; when $U_{out} \leq U_{bat}$, $U'_{out}=U_{out}-\Delta u$, wherein $\Delta u$ is an adjustment value of the voltage of the power supply.

8. The device for detecting a state of an overcurrent protector for a battery according to claim 6, wherein when $U' \leq U_H$, the state determining unit determines that the state of the overcurrent protector for the battery is ON; when $U'>U_H$, the state determining unit determines that the state of the overcurrent protector for the battery is OFF.

9. The device for detecting a state of an overcurrent protector for a battery according to claim 6, wherein when $U<U_L$ or $|I_{bat}|>I_{min}$, the state determining unit determines that the state of the overcurrent protector for the battery is ON.

10. The device for detecting a state of an overcurrent protector for a battery according to claim 6, wherein when $U>U_H$ and $|I_{bat}| \leq I_{min}$, the state determining unit determines that the state of the overcurrent protector for the battery is OFF.

* * * * *

UNITED STATES PATENT AND TRADEMARK OFFICE
CERTIFICATE OF CORRECTION

| | | |
|---|---|---|
| PATENT NO. | : 9,164,143 B2 | Page 1 of 1 |
| APPLICATION NO. | : 13/979380 | |
| DATED | : October 20, 2015 | |
| INVENTOR(S) | : Li et al. | |

It is certified that error appears in the above-identified patent and that said Letters Patent is hereby corrected as shown below:

On the title page item (74) Attorney, Agent or Firm, replace "Oppendahl" with --Oppedahl--.

Signed and Sealed this
Tenth Day of May, 2016

Michelle K. Lee
*Director of the United States Patent and Trademark Office*